(12) United States Patent
Shanker et al.

(10) Patent No.: US 8,980,765 B2
(45) Date of Patent: Mar. 17, 2015

(54) COMBINATORIAL PLASMA ENHANCED DEPOSITION TECHNIQUES

(71) Applicant: Intermolecular, Inc., San Jose, CA (US)

(72) Inventors: Sunil Shanker, Santa Clara, CA (US); Tony P. Chiang, Campbell, CA (US)

(73) Assignee: Intermolecular, Inc., San Jose, CA (US)

( * ) Notice: Subject to any disclaimer, the term of this patent is extended or adjusted under 35 U.S.C. 154(b) by 186 days.

(21) Appl. No.: 13/656,483

(22) Filed: Oct. 19, 2012

(65) Prior Publication Data

US 2013/0042811 A1 Feb. 21, 2013

Related U.S. Application Data

(63) Continuation of application No. 13/334,491, filed on Dec. 22, 2011, now Pat. No. 8,318,611, which is a continuation of application No. 12/433,842, filed on Apr. 30, 2009, now Pat. No. 8,129,288.

(60) Provisional application No. 61/050,159, filed on May 2, 2008.

(51) Int. Cl.
| | |
|---|---|
| *H01L 21/31* | (2006.01) |
| *H01J 37/32* | (2006.01) |
| *C23C 16/04* | (2006.01) |
| *C23C 16/455* | (2006.01) |
| *C23C 16/509* | (2006.01) |

(52) U.S. Cl.
CPC .......... *H01J 37/32366* (2013.01); *C23C 16/04* (2013.01); *C23C 16/45536* (2013.01); *C23C 16/45551* (2013.01); *C23C 16/45565* (2013.01); *C23C 16/45574* (2013.01); *C23C 16/5096* (2013.01); *H01J 37/32357* (2013.01)
USPC ........... 438/761; 438/758; 438/763; 438/798; 257/E21.211

(58) Field of Classification Search
None
See application file for complete search history.

(56) References Cited

U.S. PATENT DOCUMENTS

| | | | | |
|---|---|---|---|---|
| 5,453,124 | A * | 9/1995 | Moslehi et al. | 118/715 |
| 2004/0099213 | A1 * | 5/2004 | Adomaitis et al. | 118/715 |
| 2006/0177579 | A1 * | 8/2006 | Shin et al. | 427/248.1 |
| 2008/0246493 | A1 * | 10/2008 | Gardner | 324/662 |
| 2009/0061644 | A1 * | 3/2009 | Chiang et al. | 438/763 |
| 2009/0068849 | A1 * | 3/2009 | Endo et al. | 438/763 |

* cited by examiner

*Primary Examiner* — Angel Roman

(57) ABSTRACT

Combinatorial plasma enhanced deposition techniques are described, including designating multiple regions of a substrate, providing a precursor to at least a first region of the multiple regions, and providing a plasma to the first region to deposit a first material on the first region formed using the first precursor, wherein the first material is different from a second material formed on a second region of the substrate.

20 Claims, 15 Drawing Sheets

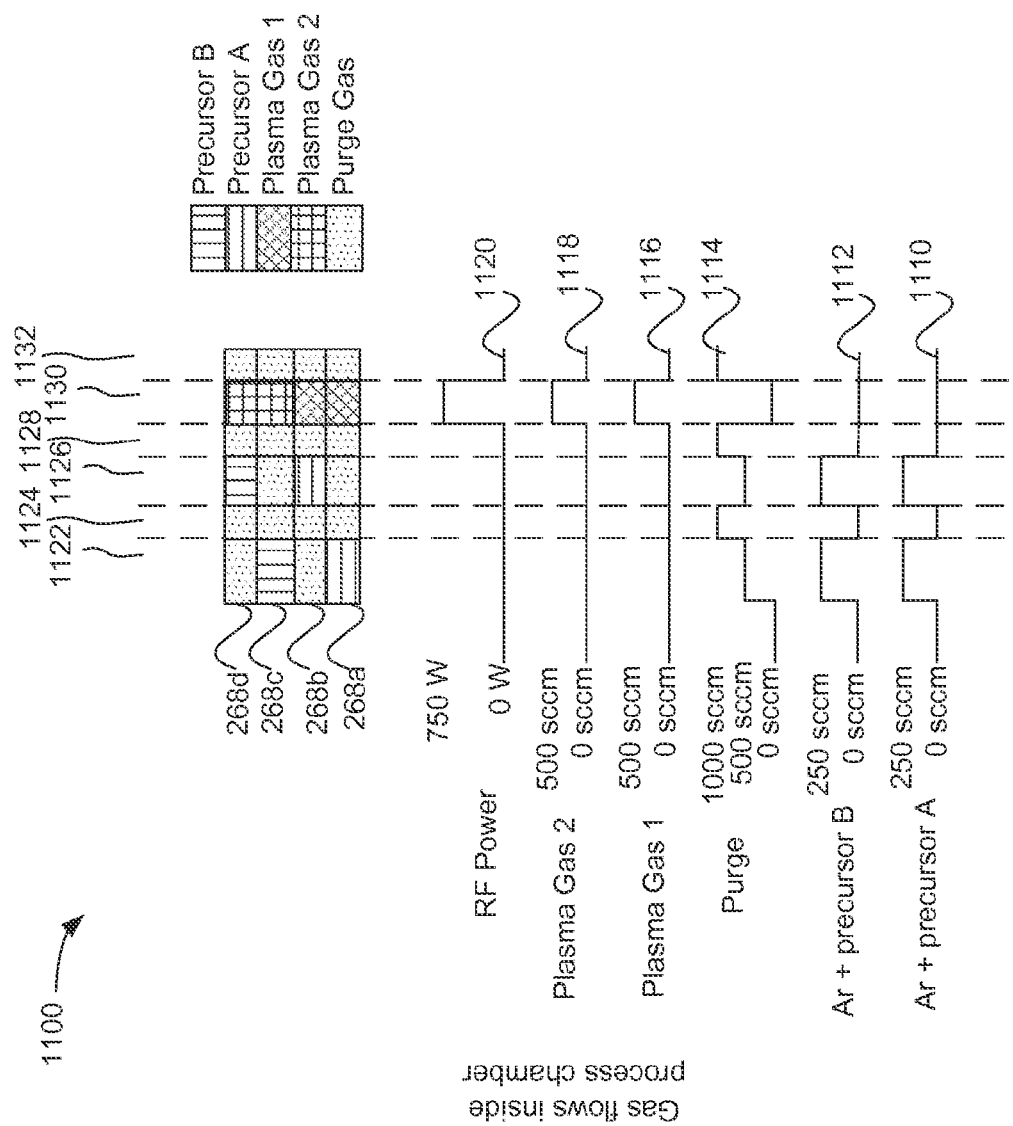

COMBINATORIAL PLASMA ENHANCED DEPOSITION TECHNIQUES

CROSS-REFERENCE TO RELATED APPLICATIONS

This application is a Continuation Application of U.S. patent application Ser. No. 13/334,491 titled "Combinatorial Plasma Enhanced Deposition Techniques," and filed on Dec. 22, 2011, which is a Continuation Application of U.S. patent application Ser. No. 12/433,842 titled "Combinatorial Plasma Enhanced Deposition Techniques," and filed on Apr. 30, 2009, now U.S. Pat. No. 8,129,288, which claims the benefit of U.S. Provisional Application No. 61/050,159 titled "Combinatorial Plasma Enhanced Deposition Techniques," and filed on May 2, 2008, each of which is incorporated herein by reference for all purposes.

This application is related to U.S. patent application Ser. No. 12/013,729 entitled "Vapor Based Combinatorial Processing" and filed Jan. 14, 2008, which is herein incorporated by reference.

FIELD OF THE INVENTION

The present invention relates generally to semiconductor processing. More specifically, techniques for combinatorial plasma enhanced deposition techniques are described.

BACKGROUND OF THE INVENTION

Chemical vapor deposition (CVD) is a process used to deposit thin films for semiconductor fabrication. CVD typically includes introducing one or more reagents (e.g., precursors) to a substrate in a processing chamber. The reagents react and/or decompose to deposit the films. Longer CVD processing times (i.e., longer exposure to reagents) typically increase layer thickness. Plasma enhanced CVD (PECVD) uses plasma in the processing chamber to increase the reaction rates of the reagents and can allow deposition at lower temperatures. Plasma species can also be used to modify the resulting film properties.

Atomic layer deposition (ALD) is a process used to deposit conformal layers with atomic scale thickness control during various semiconductor processing operations. ALD may be used to deposit barrier layers, adhesion layers, seed layers, dielectric layers, conductive layers, etc. ALD is a multi-step self-limiting process that includes the use of at least two reagents. Generally, a first reagent (which may be referred to as a precursor) is introduced into a processing chamber containing a substrate and adsorbs on the surface of the substrate. Excess of the precursor is purged and/or pumped away. A second reagent (e.g., water vapor, ozone, or plasma) is then introduced into the chamber and reacts with the adsorbed layer to form a deposited layer via a deposition reaction. The deposition reaction is self-limiting in that the reaction terminates once the initially adsorbed layer is fully reacted with the second reagent. Excess second reagent is then purged and/or pumped away. The aforementioned steps constitute one deposition or ALD "cycle." The process is repeated to form the next layer, with the number of cycles determining the total deposited film thickness. Plasma enhanced ALD (PEALD) is a variant of ALD that uses plasma as the second reagent, where plasma constitutes a quasi-static equilibrium of ions, radicals and neutrals derived from the constituent feed gases.

CVD and ALD can be performed using a processing chamber that includes a showerhead above a substrate. The reagents are introduced to the substrate through the showerhead. For plasma enhanced processes, plasma can be generated using a radio frequency (RF) or direct current (DC) discharge between two electrodes in the chamber. The discharge is used to ignite reacting gasses in the chamber.

Semiconductor research and development is typically performed by using production tools. Therefore, to explore new CVD and ALD techniques or to evaluate materials deposited using CVD or ALD, a layer must be deposited over an entire wafer. The process of investigating semiconductor processes and materials in this way can be slow and expensive.

Thus, what is needed are improvements in semiconductor development using combinatorial plasma enhanced deposition techniques.

BRIEF DESCRIPTION OF THE DRAWINGS

Various embodiments of the invention are disclosed in the following detailed description and the accompanying drawings:

FIGS. 8-11 are timing diagrams for performing combinatorial plasma enhanced ALD processing.

DETAILED DESCRIPTION

Figure 1A:
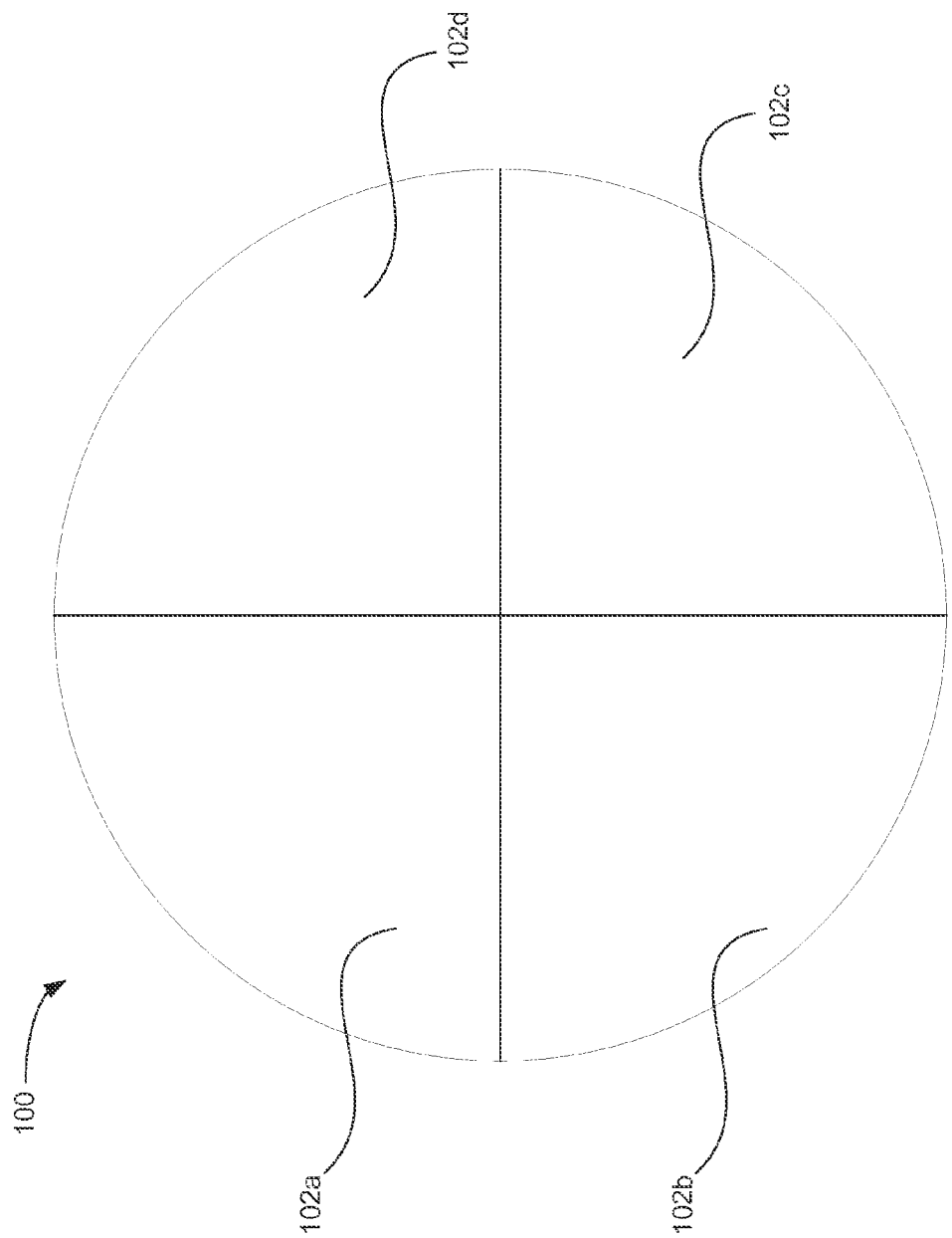
FIG. 1A illustrates a substrate having multiple regions.

A detailed description of one or more embodiments is provided below along with accompanying figures. The detailed description is provided in connection with such embodiments, but is not limited to any particular example. The scope is limited only by the claims and numerous alternatives, modifications, and equivalents are encompassed. Numerous specific details are set forth in the following description in order to provide a thorough understanding. These details are provided for the purpose of example and the described techniques may be practiced according to the claims without some or all of these specific details. For the purpose of clarity, technical material that is known in the technical fields related to the embodiments has not been described in detail to avoid unnecessarily obscuring the description.

According to various embodiments, parameters or conditions for plasma enhanced chemical vapor deposition (PECVD) and plasma enhanced atomic layer deposition (PEALD) can be varied combinatorially across regions of a substrate. The combinatorial variation can be used to explore new materials using plasma enhanced techniques or to determine optimal process parameters or conditions for performing plasma enhanced techniques. In some embodiments, plasma can be used as a reagent or enhancement over the entire substrate while other parameters (e.g., types of precursors, exposure time) are varied across regions of the substrate. In other embodiments, the types of plasma or existence of plasma can be varied across regions. For example, two regions of a substrate can be exposed to plasma, while two regions of the substrate are exposed to either no enhancements or other reagents. The resulting materials can then be characterized and evaluated to determine an optimal process solution. Techniques and devices for differentially providing plasma regions of a substrate are described below.

Plasma can be created in a processing chamber by providing a plasma gas between two electrodes and generating a voltage difference between the two electrodes. The power required to ionize the feed gases is derived from either capacitively coupled or inductively coupled sources. Plasma refers to a quasi-static equilibrium of ions, radicals and neutrals that result from certain conditions when the gases are at the optimum pressure in the presence of the applied potential. Some gasses are easier to breakdown and hence ignite (i.e., it is easier to create a plasma) than others. Additionally, the distance between the two electrodes can influence whether or not a plasma is struck. According to various embodiments described below, the composition of plasma gasses, the chamber pressure and the distance between electrodes can be varied to perform plasma enhanced deposition combinatorially. Other embodiments provide combinatorial plasma using remote sources of plasma.

I. Combinatorial Processing

"Combinatorial Processing" generally refers to techniques of differentially processing multiple regions of a substrate. Combinatorial processing can be used to produce and evaluate different materials, chemicals, processes, and techniques related to semiconductor fabrication as well as build structures or determine how the above coat, fill or interact with existing structures. Combinatorial processing varies materials, unit processes and/or process sequences across multiple regions on a substrate.

A. Multiple Regions on a Substrate

FIG. 1A illustrates a substrate 100 having multiple regions. The substrate 100 includes multiple wedge-shaped regions 102. The wedge shaped-regions 102 can be formed using techniques such CVD, ALD, PECVD, and PEALD. For example, a different material can be deposited in each of the regions 102 by varying the precursors, reagents, exposure time, temperature, pressure, or other processing parameters or conditions. The regions 102 can then be examined and compared to determine which of the materials or techniques merits further study or is useful for production. Although, as shown here, the substrate 100 is divided into four wedges, it is understood that any number of regions having any shape may be used. Additionally, the substrate 100 is a circular wafer, however any shape or size of substrate may be used, including rectangular coupons that are diced from larger wafers. The substrates or wafers may be those used in integrated circuits, semiconductor devices, flat panel displays, optoelectronic devices, data storage devices, magnetoelectronic devices, magnetooptic devices, molecular electronic devices, solar cells, photonic devices, packaged devices, and the like.

As an example, two precursors can be used to deposit two different materials on the substrate 100. A first precursor A can be used to deposit, for example, aluminum in regions 102a and 102b, and a second precursor B can be used to deposit, for example, hafnium in regions 102c and 102d. The precursor A can have a different exposure time, flow rate, etc. in region 102a than in region 102b. Additionally, one or more of the regions may use plasma as an enhancement or a reagent. The description below includes embodiments for providing a plasma to a portion of a substrate.

A unit process is an individual process used for semiconductor fabrication. Examples of unit processes for CVD and ALD processing include introducing a reagent or precursor, purging, and applying a potential between two electrodes. A process sequence is the sequence of individual unit processes used to perform a semiconductor process (e.g., to deposit a layer).

Using combinatorial processing, any of the materials, unit processes, or process sequences can be varied across regions of one or more substrates. As examples:

Different materials (or the same material having different characteristics) can be deposited on different regions of one or more substrates.

Different unit processes can be performed across regions, or variations of unit processes (e.g., expose a precursor for 10 seconds on one region and 10 seconds on another) can be performed.

The order of unit processes, e.g., the sequence of individual unit processes used to deposit one or more layers can be changed. Additionally, unit processes can be added to or omitted from process sequences.

B. Combinatorial Evaluation

Figure 1B:
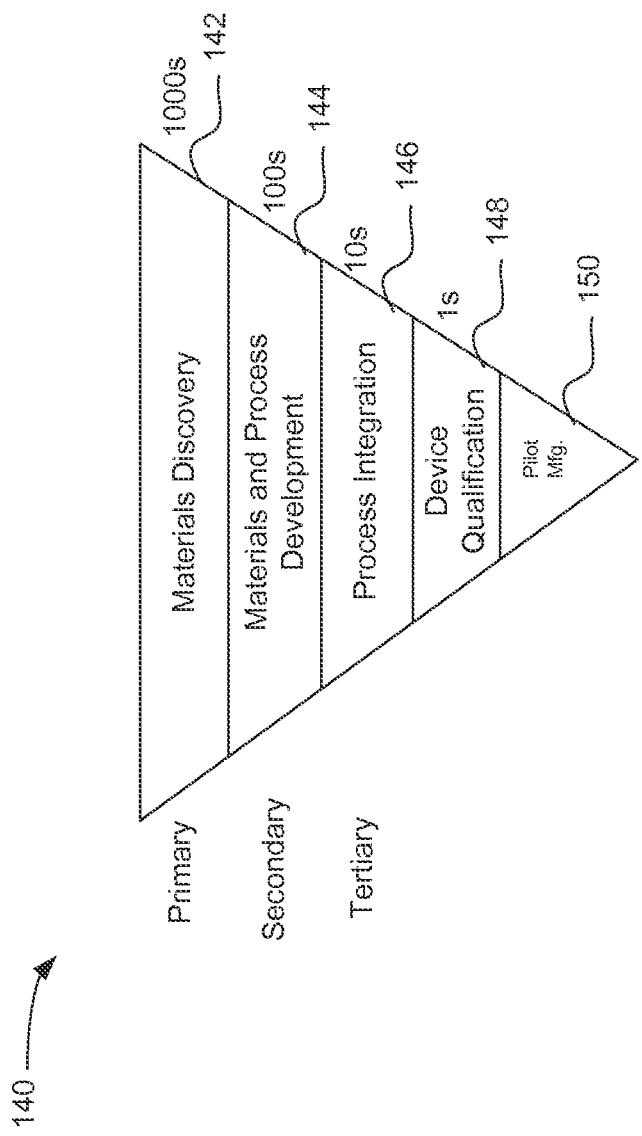
FIG. 1B is a schematic diagram illustrating an implementation of combinatorial processing and evaluation.

FIG. 1B is a schematic diagram 140 illustrating an implementation of combinatorial processing and evaluation. The schematic diagram 140 illustrates that the relative number of combinatorial processes run with a group of substrates decreases as certain materials and/or processes are selected. Generally, combinatorial processing includes performing a large number of processes and materials choices during a first screen, selecting promising candidates from those processes, performing the selected processing during a second screen, selecting promising candidates from the second screen, and so on. In addition, feedback from later stages to earlier stages can be used to refine the success criteria and provide better screening results.

For example, thousands of materials are evaluated during a materials discovery stage 142. Materials discovery stage 142 is also known as a primary screening stage performed using primary screening techniques. Primary screening techniques may include dividing wafers into regions and depositing materials using varied processes. The materials are then evaluated, and promising candidates are advanced to the secondary screen, or materials and process development stage 144. Evaluation of the materials is performed using metrology tools such as physical and electronic testers and imaging tools.

The materials and process development stage 144 may evaluate hundreds of materials (i.e., a magnitude smaller than the primary stage) and may focus on the processes used to deposit or develop those materials. Promising materials and processes are again selected, and advanced to the tertiary screen or process integration stage 146, where tens of materials and/or processes and combinations are evaluated. The tertiary screen or process integration stage 146 may focus on integrating the selected processes and materials with other processes and materials into structures.

The most promising materials and processes from the tertiary screen are advanced to device qualification 148. In device qualification, the materials and processes selected are evaluated for high volume manufacturing, which normally is conducted on full wafers within production tools, but need not be conducted in such a manner. The results are evaluated to determine the efficacy of the selected materials, processes, and integration. If successful, the use of the screened materials and processes can proceed to manufacturing 150.

The schematic diagram 140 is an example of various techniques that may be used to evaluate and select materials, processes, and integration for the development of semiconductor devices. The descriptions of primary, secondary, etc. screening and the various stages 142-150 are arbitrary and the stages may overlap, occur out of sequence, be described and be performed in many other ways.

II. Combinatorial CVD/ALD Processing System

FIGS. 2A-2E illustrate a substrate processing system 200 and components thereof in accordance with one embodiment of the present invention. The substrate processing system 200 includes an enclosure assembly 202 formed from a process-compatible material, for example aluminum or anodized aluminum. Enclosure assembly 202 includes a housing 204 defining a processing chamber 206 and a vacuum lid assembly 208 covering an opening to processing chamber 206. A wafer transfer channel 210 is positioned in housing 204 to facilitate transfer of a substrate, discussed more fully below, between processing chamber 206 and an exterior thereto. Mounted to vacuum lid assembly 208 is a process fluid injection assembly that delivers reactive and carrier fluids into processing chamber 206, discussed more fully below. To that end, the fluid injection assembly includes a plurality of passageways 212a, 212b, 212c and 212d and a showerhead 214. The chamber housing 204, vacuum lid assembly 208, and showerhead 214 may be maintained within desired temperature ranges in a conventional manner. Various embodiments of the showerhead 214 are discussed below (see e.g., FIGS. 2C-2E and 4A).

A heater/lift assembly 216 is disposed within processing chamber 206. Heater/lift assembly 216 includes a support pedestal 218 connected to a support shaft 220. Support pedestal 218 is positioned between shaft 220 and vacuum lid assembly 208, when vacuum lid assembly 208 is in a closed position. Support pedestal 218 may be formed from any process-compatible material, for example aluminum nitride and aluminum oxide ($Al_2O_3$ or alumina) and is configured to hold a substrate thereon, e.g., support pedestal 218 may be a vacuum chuck or utilize other conventional techniques such as an electrostatic chuck (ESC) or physical clamping mechanisms. Heater lift assembly 216 is adapted to be controllably moved so as to vary the distance between support pedestal 218 and the showerhead 214 to control the substrate to showerhead spacing. As described herein, the distance between the showerhead 214 and the pedestal 218 can be varied to enable or disable the ignition of a plasma across regions of a substrate. A sensor (not shown) provides information concerning the position of support pedestal 218 within processing chamber 206. Support pedestal 218 can be used to heat the substrate through the use of heating elements (not shown) such as resistive heating elements embedded in the pedestal assembly.

Figure 2A:
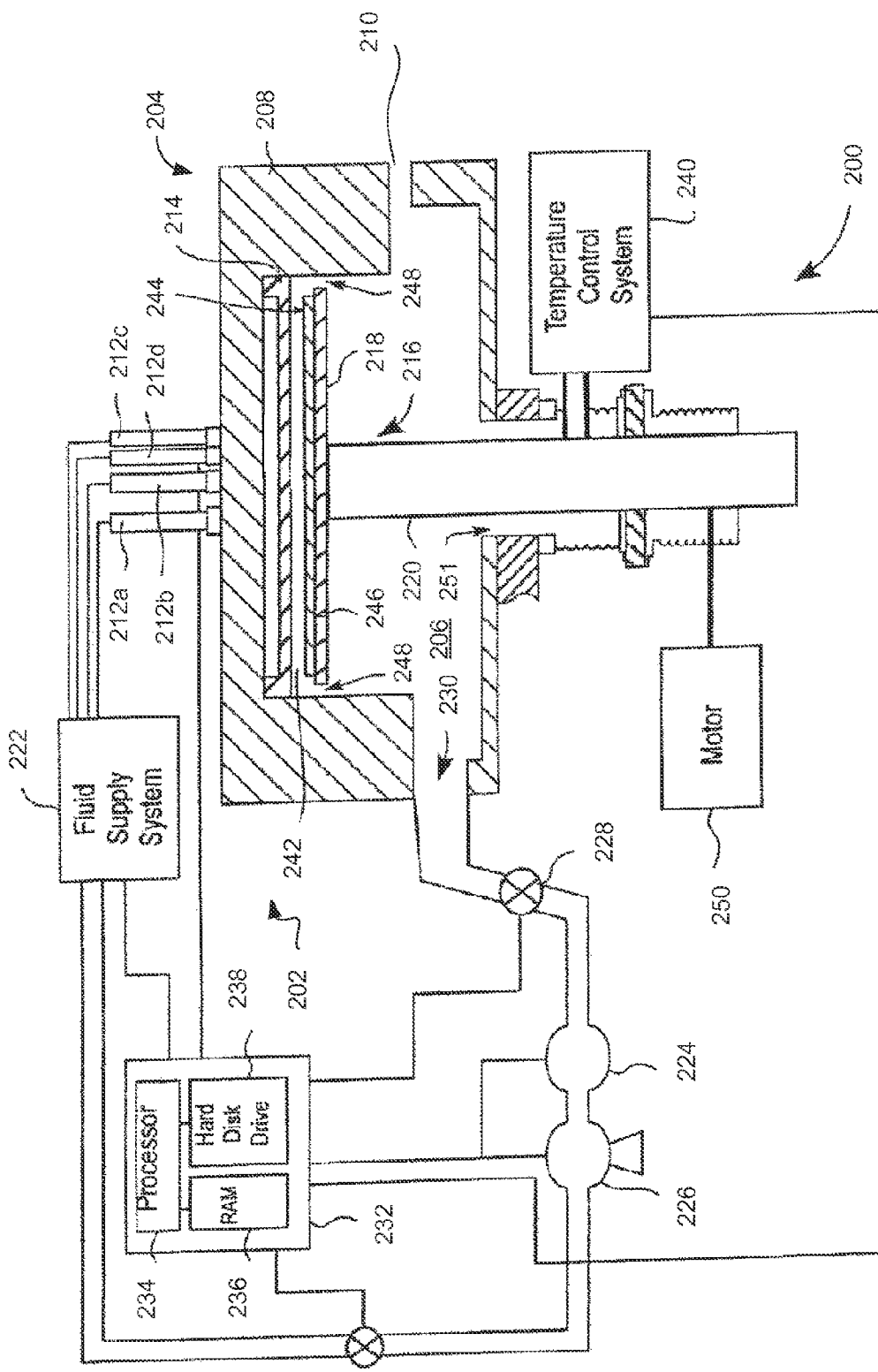
FIGS. 2A-2E illustrate a substrate processing system and components thereof in accordance with one embodiment of the present invention.
Figure 2B:
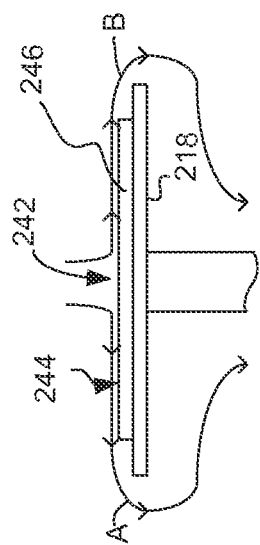

Referring to both FIGS. 2A and 2B a fluid supply system 222 is in fluid communication with passageways 212a, 212b, 212c and 212d through a sequence of conduits. Flows of processing fluids, from fluid supply system 222, within processing chamber 206 are provided, in part, by a pressure control system that may include one or more pumps, such as turbo pump 224 and roughing pump 226 both of which are in fluid communication with processing chamber 206 via a butterfly valve 228 and pump channel 230. To that end, a controller 232 regulates the operations of the various components of system 200. Controller 232 includes a processor 234 in data communication with memory, such as random access memory 236 and a hard disk drive 238 and is in signal communication with turbo pump 224, temperature control system 240, fluid supply system 222 and various other aspects of the system as required. System 200 may establish conditions in a processing region 242 of processing chamber 206 located proximate to a surface 244 of a substrate 246 disposed on support pedestal 218 to form desired material thereon, such as a thin film. To that end, housing 204 is configured to create a peripheral flow channel 248 that surrounds support pedestal 218 when placed in a processing position to provide processing region 242 with the desired dimensions based upon chemical processes to be achieved by system 200. Pump channel 230 is situated in housing 204 so that processing region 242 is positioned between pump channel 230 and showerhead 214.

The dimensions of peripheral flow channel 248 are defined to provide a desired conductance of processing fluids therethrough which provide flows of processing fluids over a surface of substrate 246 in a substantially uniform manner and in an axisymmetric fashion as further described below. To this end, the conductance through pump channel 230 is chosen to be larger than the conductance through peripheral flow channel 248. In one embodiment, the relative conductance of processing fluids through pump channel 230 and peripheral flow channel 248 is, for example, 10:1, wherein the conductance of pump channel 230 is established to be at least ten (10) times greater than the conductance of processing fluids through peripheral flow channel 248. Such a large disparity in the conductance, which may be other ratios, serves to facilitate axisymmetric flow across the surface of substrate 246 as shown by flows A and B moving through processing region 242 and subsequently passing substrate 246 and support pedestal 218 toward pump channel 230.

To provide plasma to the substrate 246, a voltage difference can be created between the showerhead 214 and the pedestal 218 while a plasma gas is supplied to the processing region 242. To this end, the potential can be created by: 1) connecting the showerhead 214 to a power source such as a radio frequency (RF) power source and the pedestal 218 to ground; 2) connecting the showerhead 214 to ground and the pedestal 218 to a power source such as an RF power source; or 3) connecting both the showerhead 214 and the pedestal 218 to power sources (e.g., RF) having different phases. It is to be appreciated that any other technique for creating a potential difference between the showerhead 214 and the pedestal 218 can also be used. For example, instead of using an RF power source, a direct current (DC) power source can also be used. A plasma gas is the gas that will be ignited by the voltage difference. For example, the plasma gas could be argon, hydrogen, oxygen, nitrogen, or any combination thereof. As will be described below, multiple plasma gasses can be used so that a plasma ignites over some regions of the substrate and not others.

Figure 2C:
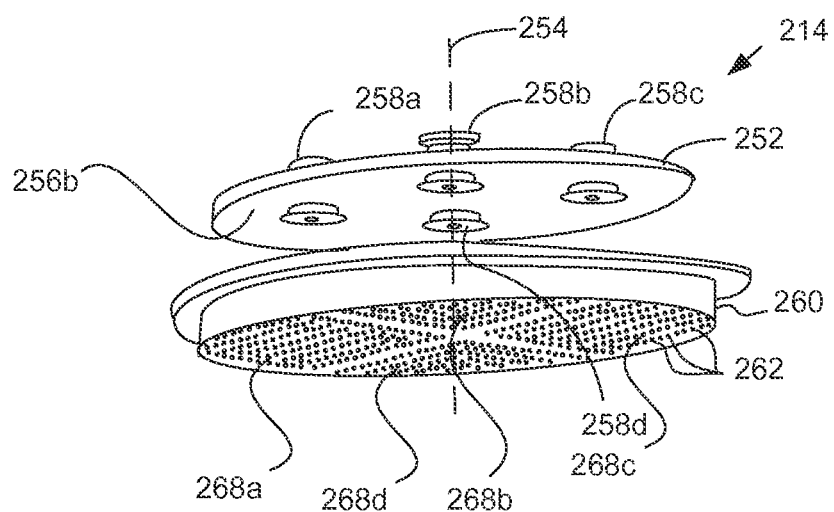
Figure 2D:
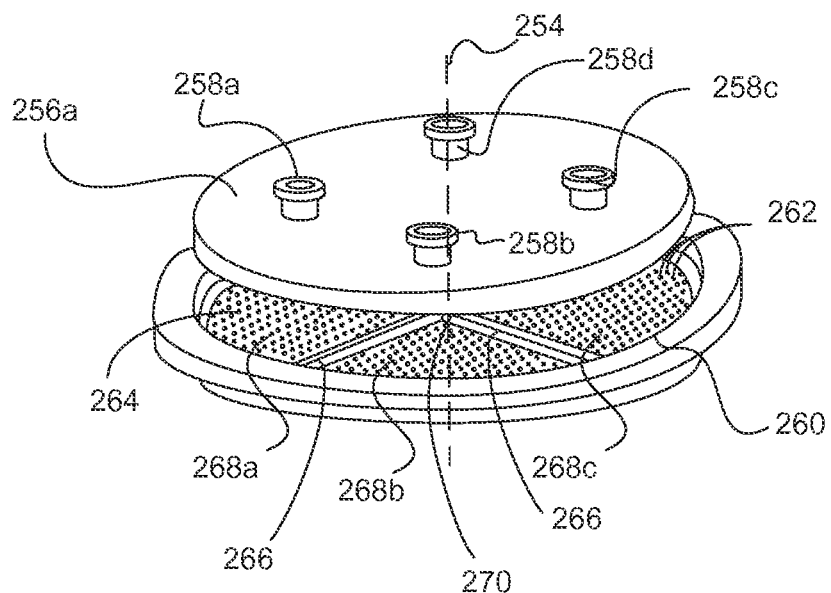

Referring to FIGS. 2B-2D, to facilitate the occurrence of flows A and B, showerhead 214 includes a baffle plate 252 that is formed to be radially symmetric about a central axis 254, but need not be. Baffle plate 252 has first and second opposed surfaces 256a and 256b, with a plurality of through ports 258a, 258b, 258c and 258d extending therebetween. Coupled to baffle plate 252 is a manifold portion 260 having a plurality of injection ports 262 extending through manifold portion 260. Manifold portion 260 is typically disposed to be radially symmetric about axis 254. Manifold portion 260 is spaced-apart from surface 256b to define a plenum chamber 264 therebetween. Manifold portion 260 may be coupled to baffle plate 252 using any means known in the semiconductor processing art, including fasteners, welding and the like.

Baffle plate 252 and shower head 214 may be formed from any known material suitable for the application, including stainless steel, aluminum, anodized aluminum, nickel, ceramics and the like.

Referring to FIGS. 2B-2D, extending from manifold portion 260 is a fluid separation mechanism that includes a body 266 extending from manifold portion 260 toward baffle plate 252. The distance that body extends from surface is dependent upon the specific design parameters and may extend to cover part of the distance or the entire distance to create segments within the plenum 264, as discussed more fully below. In one embodiment, body 266 may extend between the manifold 260 and baffle 252 in two orthogonal directions to create four regions, referred to as quadrants or segments 268a, 268b, 268c and 268d. Although four quadrants are shown, any number of segments may be provided by adding additional body portions 266 or modifying the port location and/or showerhead outlet pattern, depending upon the number of regions one wants to or can define on substrate 246. A vertex 270 of body 266 is generally aligned with axis 254. Passageways 212a-212d are configured to direct fluid through four ports shown as 258a-258d. In this manner, ports 258a-258d are arranged to create flows of processing fluids that are associated with a corresponding one of quadrants 268a-268d. The body 266 provides sufficient separation to minimize, if not prevent, fluids exiting ports 258a-258d from diffusing between adjacent quadrants 268a-268d. In this manner, each of the four ports 258a-258d directs a flow of processing fluids onto one of quadrants 268a-268d that differs from the quadrants 268a-268d into which the remaining ports 258a-258d direct flows of processing fluids.

Figure 2E:
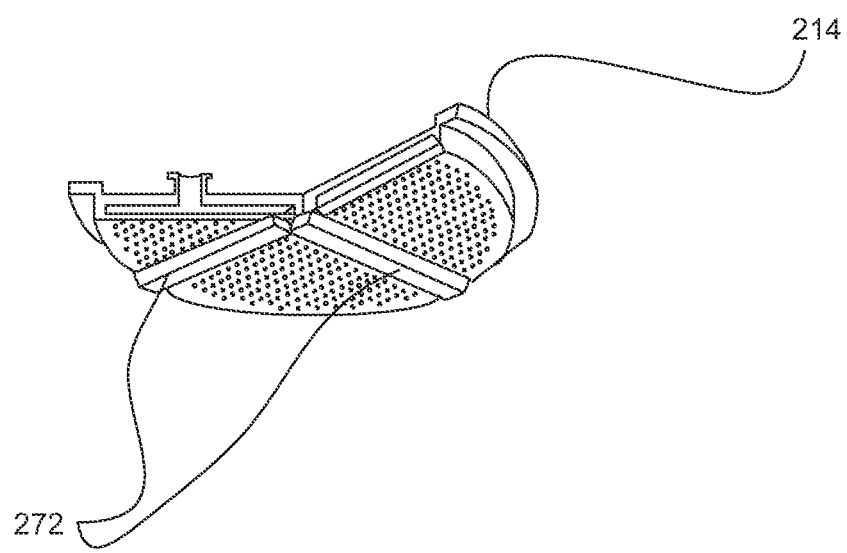
Figure 3:
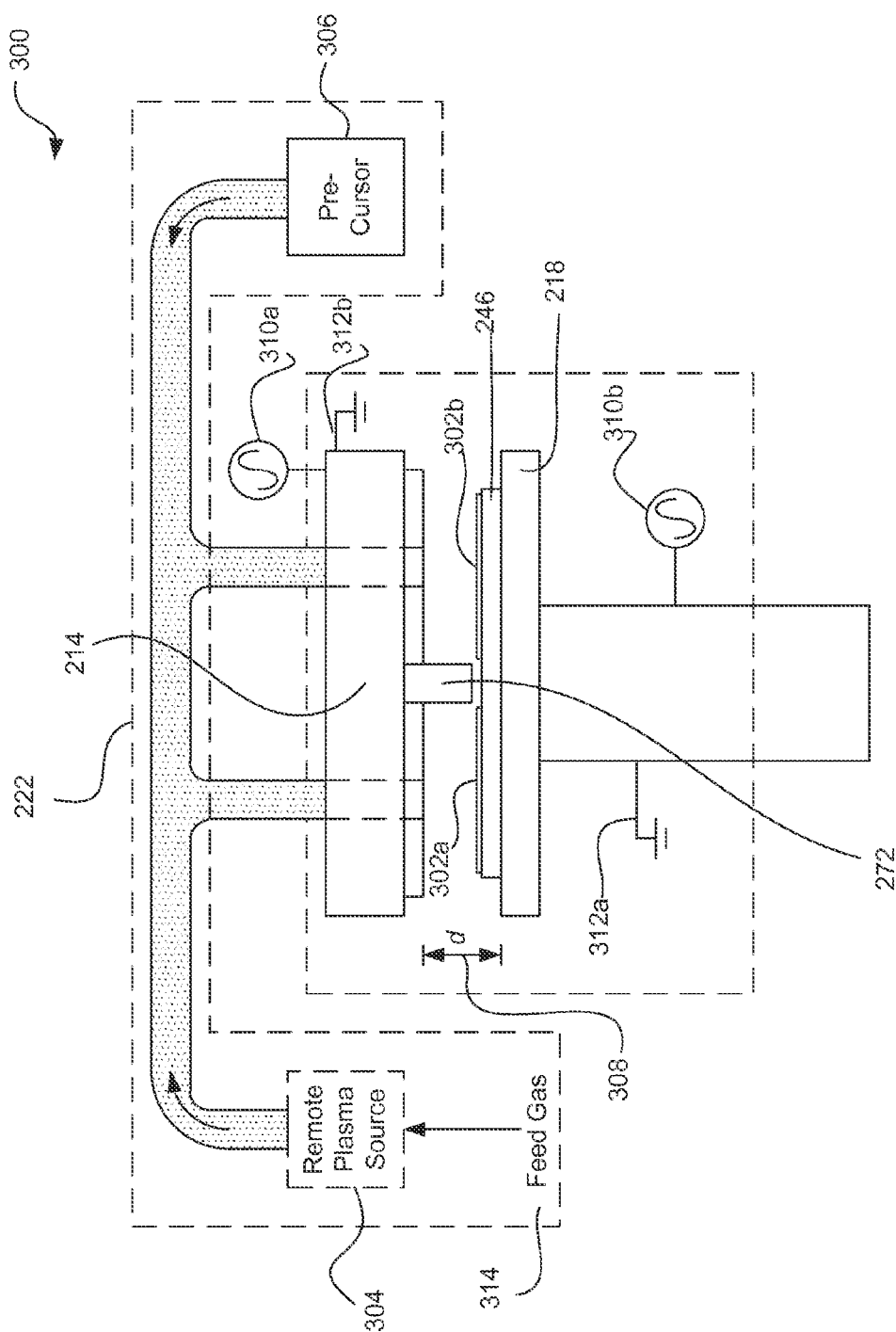
FIG. 3 is a simplified diagram showing a processing system capable of depositing different materials in multiple regions under varying conditions using plasma-enhanced CVD (PECVD) or plasma-enhanced ALD (PEALD)
Figure 4B:
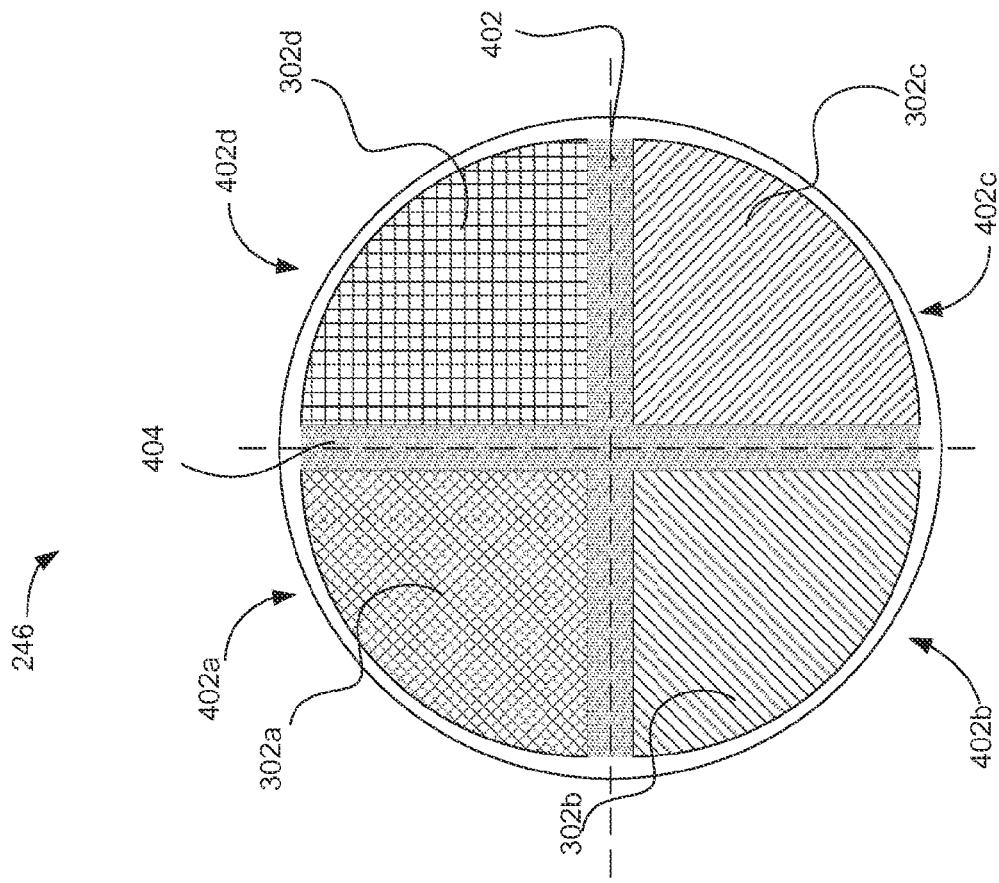
FIG. 4B illustrates a substrate having multiple regions with different materials deposited thereon.
Figure 4A:
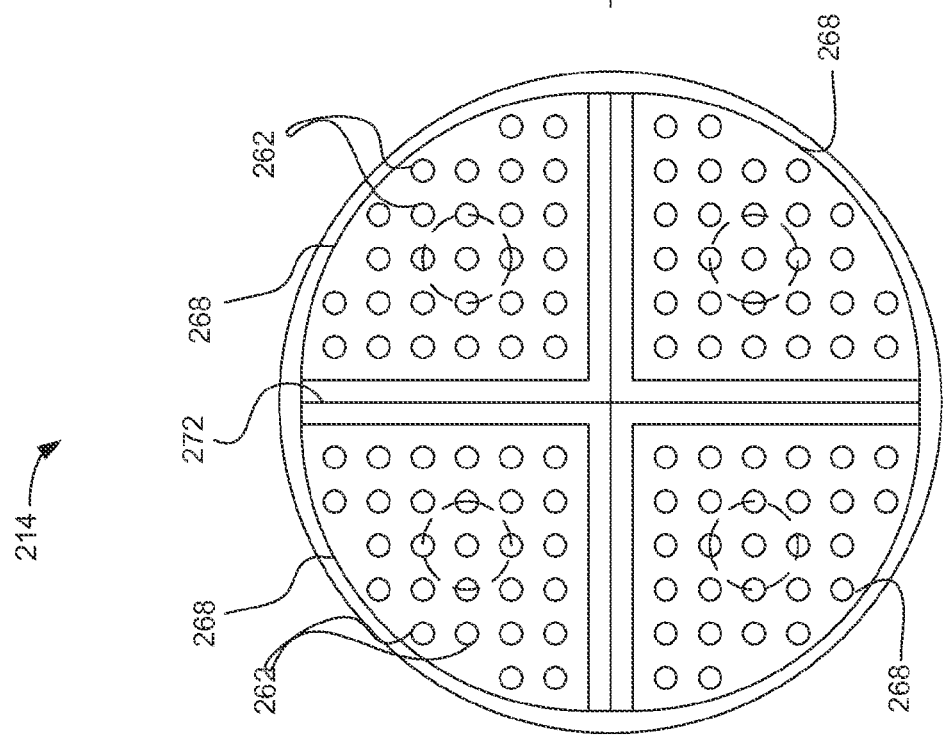
FIG. 4A is a view of the underside of a showerhead for a deposition system.

FIG. 2E illustrates optional protrusions extending from the underside of the showerhead 214. The protrusions 272 are used to isolate the regions of the substrate. Protrusions 272 can be arranged such that there is a protrusion to isolate each region of the substrate. For example, as shown in FIG. 2E, four protrusions 272 are used to isolate or substantially isolate four regions on the substrate 246. The protrusions 272 may substantially prevent gasses such as reagents from migrating from the region in which they are intended to be introduced to an adjoining region. Additionally the protrusions 272 also prevent a plasma generated in one region from spreading and igniting gases in the other region The protrusions 272 can be in contact with the substrate 246 or some distance from the surface 244 of the substrate (e.g., 0.5-5 mm) The spacing between the protrusions and the wafer become important in ensuring a dark space where plasma cannot sustain itself III. Combinatorial PEVCD/PEALD Processing System A. Segmented Showerhead for Combinatorial PECVD/PEALD FIG. 3 is a simplified diagram showing a processing system 300 capable of depositing different materials under varying conditions using plasma-enhanced CVD (PECVD) or plasma-enhanced ALD (PEALD). FIG. 4A is a view of the underside of the showerhead 214. FIG. 4B illustrates the substrate 246 having multiple regions 402 with different materials 302 deposited thereon.

Using the processing system 300, plasma can be selectively applied to regions of the substrate 246 such that different materials (e.g., materials 302a-302d) are formed on different regions 402a-402d of the substrate 246. The materials 302a-302d can be considered different if they are formed using varying processing parameters. For example, different precursors can be used in different regions, the same precursors can be used but with and without plasma in some regions, or some combination of parameters (e.g., RF power, duration, etc.). The regions 402 and the segments 268 of the showerhead 214 may have any size, shape, or configuration, but according to one embodiment, the regions 402 have a common size and shape. According to various embodiments, parameters or conditions of PECVD and PEALD that can be varied for combinatorial processing include power to ignite plasma, flow of plasma and other gasses, the type of plasma gas, pressure, selection of precursors, exposure time, spacing, etc.

Plasma can also be used to pre-treat a substrate prior to an ALD or CVD process. Plasma can be used, for example, to remove contamination such as unwanted oxidation on the surface of a substrate. For example, if a copper substrate has surface oxides, the plasma can be applied to remove the unwanted oxides. Other plasma pre-treatments, such as to improve wettability of the substrate, can also be used. The plasma can be applied either to the entire substrate or combinatorially to some regions and not to others. Either parameters of the plasma (e.g., plasma gas composition) or the use of plasma versus not using plasma can be varied across regions of a substrate and evaluated in a combinatorial process. In some embodiments, combinatorial plasma pre-treatment can be used with subsequent non-combinatorial ALD or CVD processes (i.e., using the same processing conditions across the entire substrate).

Additionally, the entire substrate 246 may have plasma applied to it, but using different precursors or other processing conditions across different regions so that different materials are deposited. As used herein, a material (e.g., comprising a thin film or layer) is different from another material if the materials have different compositions, grain structures, morphologies, thicknesses, etc. In one embodiment, the fluid flow into the chamber 206 is approximately constant amount of flow across each region (e.g., 250 sccm). The timing diagrams of FIGS. 8-11 explain the total fluid flow in more detail.

Using plasma or other reagents during the second half of an ALD cycle or using plasma to enhance CVD processes can be a combinatorial variable according to various embodiments. Various techniques can be used to provide isolated plasma within the chamber 206. According to embodiments described herein, plasma can be provided to individual regions (and not to others) of the substrate 246 either in situ or ex situ:

Ex situ application of plasma can be performed using a remote plasma source 304 that generates ions, atoms, radicals and other plasma species. The plasma species from the remote plasma source 304 are provided to the substrate 246 using the fluid supply system 222. The remote plasma source 304 receives a feed gas 314 (i.e., a plasma gas) such as oxygen, hydrogen, ammonia, or argon and generates plasma species such as radicals, ions, atoms, etc. The remote plasma source 304 can be any type of plasma source such as a radiofrequency, microwave, or electron cyclotron resonance (ECR) upstream plasma source.

The fluid supply system 222 can deliver fluids from multiple sources. For example, one or more ALD or CVD precursors 306 can be simultaneously or sequentially provided to regions 402 the substrate 246. When using a plasma enhanced ALD system, the precursor and the plasma are both reagents that are reacted to form layers on the substrate 246. Ex situ plasma can be differentially applied by flowing plasma species to some of the regions 402 and not to others or by using different plasma characteristics or parameters for different regions 402.

In situ plasma can be provided by creating a voltage difference between two electrodes (e.g., the showerhead 214 and the pedestal 218). In situ plasma can be differentially applied by flowing different gasses to different regions 402 of the substrate 246. Paschen's Law dictates the conditions under which a plasma is formed through a gas. According to Paschen's law, for a given gas between two electrodes, a plasma is formed when a voltage difference greater than or equal to a breakdown voltage ($V_B$) is applied between the two electrodes (e.g., the showerhead 214 and the pedestal 218). $V_B$ is dependent on the distance between the electrodes (e.g., the distance d 308) and the pressure of the gas inside the chamber:

$$V_B = f(pd) \qquad \text{Equation 1}$$

where f is an intrinsic property of the gas present in the chamber. Accordingly, for constant distance between the electrodes and a constant pressure in the chamber 206, the ignition of a plasma when a voltage difference is applied depends on an intrinsic property of the plasma gas. According to an embodiment of the invention, one segment 268 of the showerhead 214 can provide a gas that ignites easily (e.g., Ar), while another segment 268 provides a gas that is difficult to ignite (e.g., $H_2$). Other plasma gasses that can be used include oxygen, nitrogen, ammonia, etc. In this way, plasma can be provided to one region 402 of the substrate 246, while it is not provided to another region 402. As a result, different materials can be formed in the multiple regions 402 of the substrate 246 in a combinatorial manner by varying the plasma. For example, plasma can be used as a reagent in one region 402a of substrate 246 while another reagent is used in a second region 402b of the substrate 246. Examples of doing so are described below regarding the timing diagrams in FIGS. 8-11. Other techniques for providing plasma to some regions of the substrate 246 and not others are described below.

A voltage difference between the showerhead 214 and the pedestal 218 can be provided in several ways. According to one embodiment, a radiofrequency (RF) power source 310 is attached to one or both of the showerhead 214 and the pedestal 218. The RF power source can use any frequency including 2 megahertz (MHz), 3.39 MHz, 13.56 MHz, 60 MHz, 300-500 kilohertz (kHz) and other frequencies. In one embodiment, the showerhead 214 is powered using the power source 310a and the pedestal 218 is attached to a ground 312a. In a second embodiment, the pedestal 218 is attached to the power source 310b and the showerhead is attached to a ground 312b. In a third embodiment, both the showerhead 214 and the pedestal 218 are attached to the RF power sources 310a and 310b, respectively. With the third embodiment, the power sources 310a and 310b can be offset in either or both of frequency or phase. Any of these embodiments can provide the voltage differences between the showerhead 214 and the pedestal 218 to ignite or not ignite a plasma in the chamber 206 as desired. Other types of power sources, such as direct current (DC) power sources, can also be used to generate the voltage difference. According to one embodiment, to avoid damage to preformed devices on a substrate, the power supplied is less than 1.0 W/cm². However, it is understood that any amount of power can be used.

FIG. 4A is an underside view of the showerhead 214. The segments 268 and injection ports 262, as well as the protrusions 272 are visible. FIG. 4B is an overhead view of the substrate 246 having different materials combinatorially deposited thereon. The segments 268, in this embodiment, correspond to the regions 402 of the substrate 246. Therefore, precursors to form the materials 302 are emitted by the corresponding segments 268 of the showerhead 214.

"Dark" regions 404 are the areas between the regions 402 of the substrate 246. The dark regions 404 are in between the exposed regions 402 and exposure to reagents in the dark regions 404 is primarily the result of reagent migration from the exposed regions 402. These dark regions 404 can be minimized or eliminated in some embodiments by using protrusions 272 or by adjusting the flow conditions in the chamber, flow, port location and/or showerhead configurations, and other possible techniques.

When a precursor or a gas is introduced by gas injection system 222, the chemical reagents interact on the substrate 246 to form the materials 302. The substrate 246 has different materials 302 deposited on four different regions 402. As described above, materials can be considered different if they vary in any substantive way, such as in composition (i.e., chemical constituents), morphology, thickness, etc. For example, each of the materials 302 could be deposited using different precursors. The material 302a could be tantalum (formed using a tantalum precursor such as tris(diethylamino)(tert-butylimido) tantalum (TBTDET)), the material 302b could be titanium (formed using a titanium precursor such as tetrakis diethylamido titanium (TDEAT)), the material 302c could be hafnium (formed using a hafnium precursor such as tetrakis (dimethylamido) hafnium (TDMAHf)), and the material 302d could be ruthenium (formed using a ruthenium precursor such as bis (methylcyclopentadienyl) ruthenium ($Ru(MeCp)_2$)). In this manner, four different materials are combinatorially deposited using four different precursors. Alternatively, processing sequences or other processing conditions can be varied by region or across regions to create a combinatorial array. The specific variation is generally defined in the design of experiment, but need not be so defined.

According to an embodiment, one process parameter that can be varied across regions is the presence or absence of plasma in a region of the substrate. For example, a plasma could be ignited in the region 402a, but not in the regions 402b-402d. The plasma could be a reagent used with a PEALD or PECVD process. Other reagents (e.g., water vapor) can be used for the other regions in which no plasma is struck. As described above, the ignition of a plasma depends on the distance between the electrodes (e.g., the showerhead 214 and the pedestal 218), the pressure in the chamber 206, and the gas used for the plasma. Embodiments of the invention describe varying the distance and gas composition to differentially provide plasma across a substrate.

B. Alternative Showerhead for Combinatorial PECVD/PEALD

Figure 5:
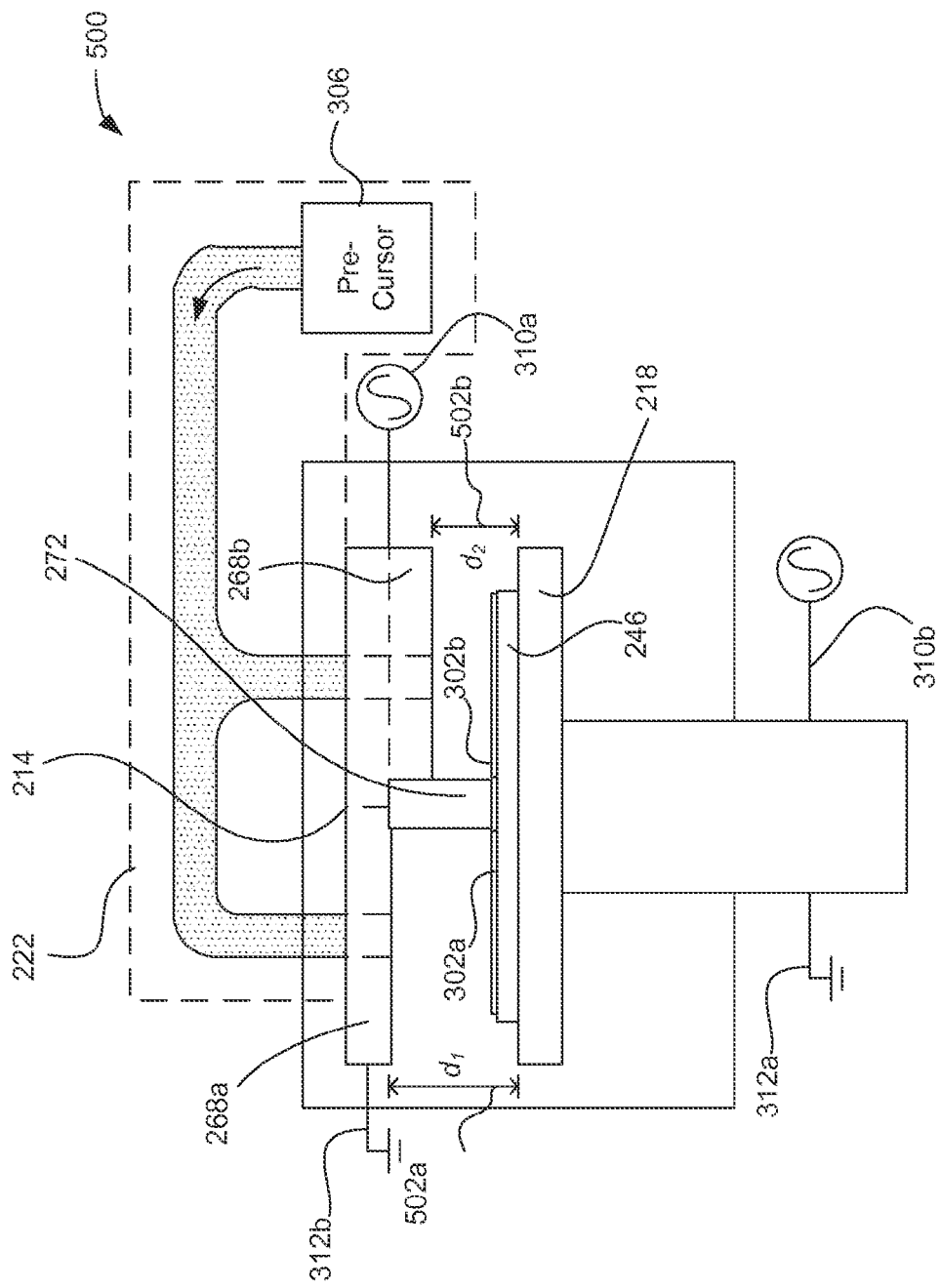
FIG. 5 illustrates a combinatorial processing system including an alternative showerhead for performing combinatorial material deposition.

FIG. 5 illustrates a combinatorial processing system 500 including an alternative showerhead 214 for performing combinatorial material deposition. As discussed above, the ignition of a plasma (i.e., the breakdown voltage) depends on the distance between the electrodes (e.g., the showerhead 214 and the pedestal 218). The alternative showerhead 214 shown includes segments 268a and 268b having different distances (e.g., the distances $d_1$ 502a and $d_2$ 502b) from the pedestal 218. A single plasma gas can be fed into the chamber, and the plasma gas and the position of the pedestal can be chosen so that the distance 502a is too large to ignite a plasma, while the distance 502b is sufficient to ignite a plasma or vice versa (e.g., the distance 502a ignites a plasma and the distance 502b is too small to ignite a plasma). In this way, a plasma can be ignited in some regions, and not in others.

According to another embodiment, the segments 268 can be dynamically movable relative to the substrate 246. For example, the distances $d_1$ 502a and $d_2$ 502b can be dynamically adjusted according to the requirements of a particular combinatorial experiment. Additionally, the showerhead 214 (including the alternative showerhead shown here) can be moved as a unit relative to the substrate 246 to change the distances $d_1$ 502a and $d_2$ 502b. Further, either or both of the showerhead 214 or the pedestal 218 can be rotatable to alter the distance between the showerhead 214 and a region 404 of the substrate 246 when using the alternative showerhead 214 shown here.

C. Moving Plasma between Regions

A plasma can be ignited in one region 402 of a substrate 246 and subsequently moved to another region 402 to effect combinatorial processing. Two techniques for moving a plasma from one region to another region are described.

1. Changing Gas Mixture

A first technique uses the showerhead 214 shown in FIGS. 2C-2E and 3. The showerhead 214 creates a plasma in a first region, e.g., the region 402a, by providing a plasma gas (e.g., Ar) and a voltage difference between the showerhead 214 and the pedestal 218, while using a gas that does not ignite in the other regions 402 of the substrate 246. At a later time, the voltage difference is maintained, but the plasma gas in the first region is changed to one that does not ignite under the circumstances (e.g., a purge gas), and a plasma gas (e.g., Ar) that does ignite under the circumstances is then fed into a second region (e.g., the region 402b). The removal of the ignitable plasma gas from the first region and introduction of an ignitable gas into the second region transfers the plasma from the first region to the second region. According to an embodiment, there may be a period of overlap where there is a plasma in both regions. According to further embodiments, any number of regions may have a plasma at any time, and the regions may or may not be adjacent.

2. Rotating Pedestal

According to one embodiment, the pedestal 218 can be rotatable. A plasma can be struck in one region (e.g., the region 402a) by providing an appropriate plasma gas through a segment (e.g., the segment 268a) of the showerhead 214 corresponding to the region. The substrate 246 can be rotated to transfer the plasma to another region (e.g., the region 402b).

This embodiment can also be used with the alternative showerhead 214 shown in FIG. 5. For example, with the alternative showerhead 214 shown in FIG. 5, the region 402a can be exposed to a precursor emitted by the segment 268a and the region 402b can be exposed to a precursor emitted by the segment 268b. In this example, the segment 268b is closer to the pedestal 218 and a plasma ignites in the region 402b, but not in the region 402a. The pedestal 218 can be rotated to transfer the plasma to the region 402a by moving the region 402a underneath the segment 268b.

Additionally, the rotation of the pedestal 218 can be used to create additional regions. For example, if the showerhead 214 is divided into four segments 268, more than four different materials 302 can be created on the substrate 246 by rotating the pedestal 218. The pedestal can be rotated by ½ a region (i.e., 45°) in this example to create eight regions. Four precursors can be emitted by the four segments 268. During the emission of those precursors, the pedestal 218 can be rotated by 45° to create an additional four regions by exposing half of each region to another precursor. For example, precursor A is emitted by segment 268a onto region 402a, and precursor B is emitted by segment 268b onto region 402b. During the exposure of the precursors, the pedestal is rotated so that half of region 402a is now exposed to precursor B, while the remainder of region 402a continues to be exposed to precursor A. The resulting eight regions include four regions exposed to a single precursor and four regions that are exposed to a mixture of precursors. It is understood that any number of regions combined with any amount of rotation and exposure to precursors can be used to create any number of regions.

D. Electrical Equivalence Circuit

Figure 6:
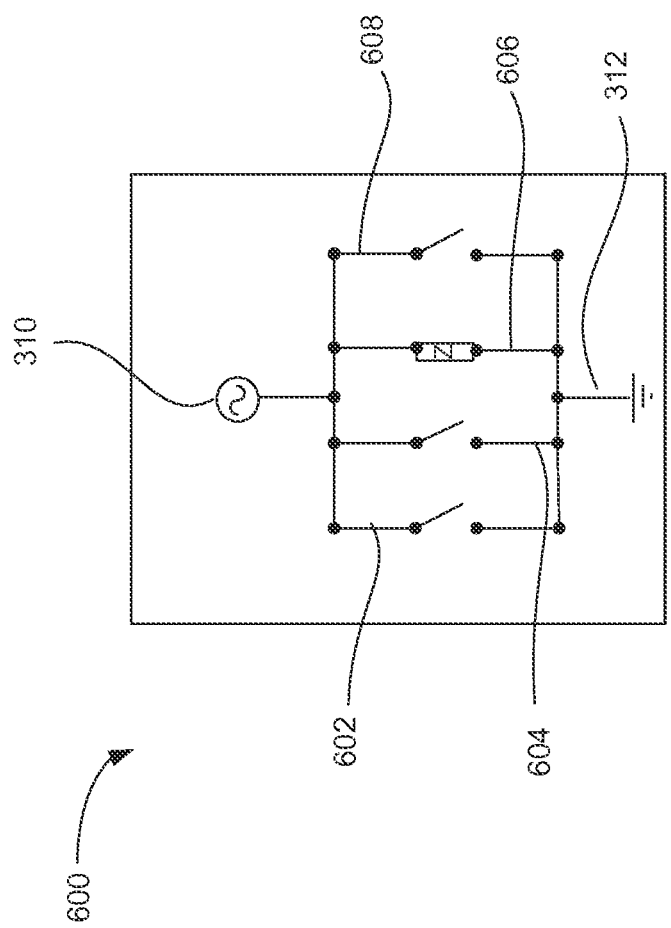
FIG. 6 is an electrical equivalence circuit showing the ignition of plasma in one region of a substrate and not in others.

FIG. 6 is an electrical equivalence circuit 600 showing the ignition of plasma in one region of a substrate and not in others. The equivalence circuit 600 shows the flow of current through segments 268 and regions 402 of the substrate. For example, open switches 602, 604, and 608 indicate that there is no plasma in the regions 402a, 402b, and 402d, respectively. The closed switch 606 indicates a flowing current and the existence of plasma in the region 402c. The ignition of a plasma in a region effectively completes a circuit between the two electrodes (i.e., the showerhead 214 and the pedestal 218) in that region. In this example, the region 402c represented by the closed switch 606 has a plasma gas that ignites more easily than the plasma gasses in the other regions. In another example as described regarding FIG. 5, the distance between the showerhead 214 and the pedestal 218 in the region 402c may be different than the distance between the showerhead 214 and the pedestal 218 in other regions.

IV. Process for Performing Combinatorial Evaluation using PECVD or PEALD

Figure 7:
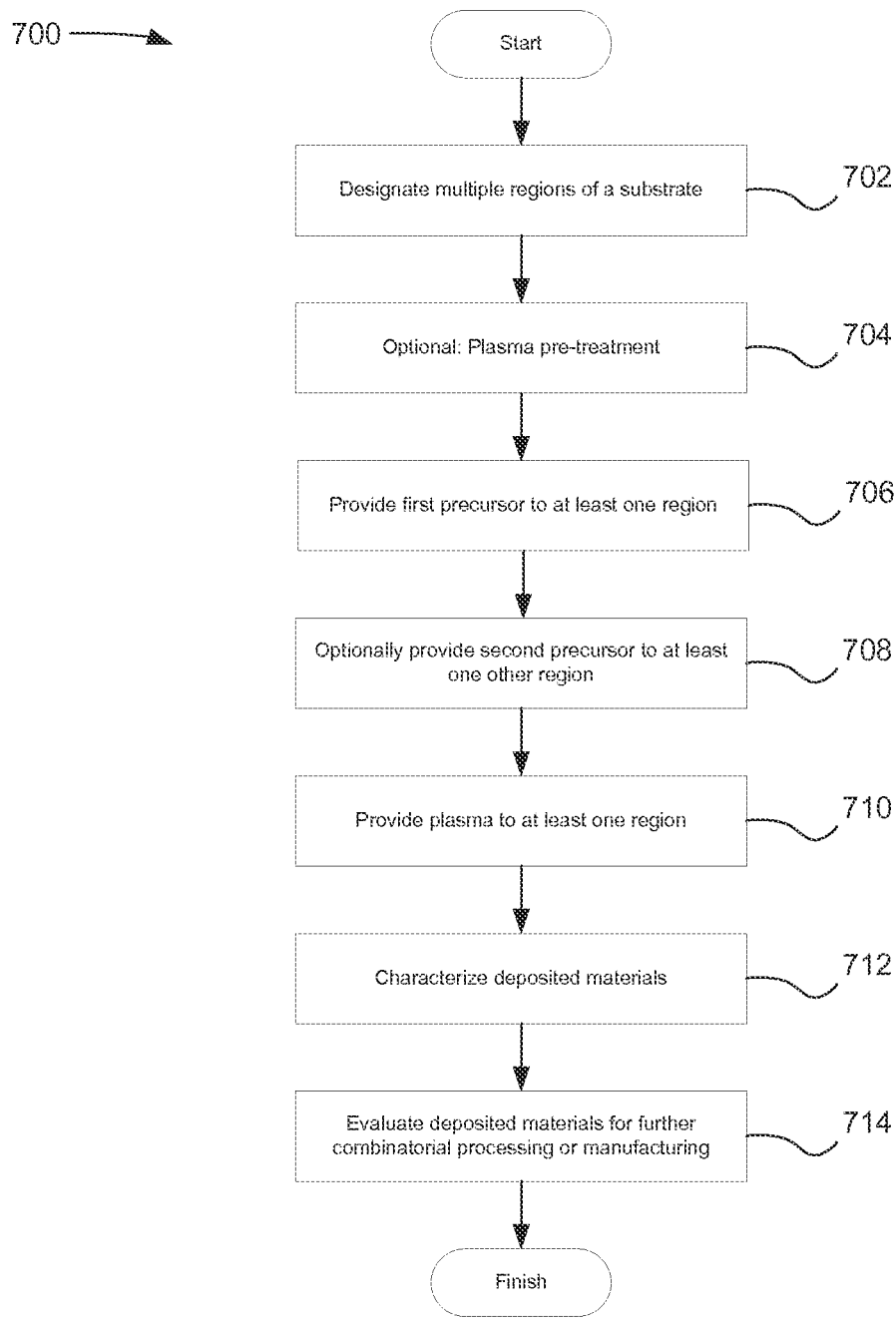
FIG. 7 is a flowchart describing a process for varying plasma across multiple regions of a substrate to process the substrate combinatorially.

FIG. 7 is a flowchart describing a process 700 for varying plasma across multiple regions of a substrate to process the substrate combinatorially. The process 700 described in FIG. 7 is one embodiment of forming a material or analyzing deposition parameters (e.g., precursors, temperatures, existence of plasma) in a combinatorial fashion using PECVD or PEALD.

In operation 702, multiple regions of a substrate are designated. In some embodiments, designating the regions includes determining the approximate location and boundaries of regions of a substrate. For example, as shown in FIG. 4B, several regions 402 are designated on the substrate 246. The regions can, in some embodiments, be at least partially physically isolated using, for example, protrusions 272. Alternatively, no protrusions 272 are used, and the regions correspond to segments 268 of the showerhead 214.

In operation 704, a plasma pre-treatment is optionally performed. Plasma can be applied to one or more regions 402 (or to the entire substrate 246) prior to deposition processes. For example, the plasma pre-treatment can be used to remove oxidation or other contamination that may have formed on a substrate, or can be used to change other characteristics, such as the wettability of the substrate. The plasma pre-treatment can also be used to improve the nucleation of ALD or CVD precursors. The plasma pre-treatment can be applied to one or more regions 402 and not to others by using different plasma gasses in different regions 402, by applying ex-situ plasma differentially, or by using the alternative showerhead 214 shown in FIG. 5.

In operation 706, a first precursor is provided to at least one of the regions of the substrate (e.g., to the region 402a). The first precursor may be a precursor selected to deposit a material, for example TDMAHf to deposit a hafnium based layer. In operation 708, a second precursor is optionally provided to at least one of the regions other than those to which the first precursor is provided (e.g., to the region 402b). The second precursor may be selected to deposit another material different from the material formed by the first precursor, for example, TDEAT or TDMAT to deposit a titanium containing layer.

In some embodiments, the combinatorial variation is with respect to the provision of plasma to the regions. For example, the same precursor may be provided to all the regions of the substrate, while a plasma is struck in a first region and not in a second region. Alternatively, one region of the substrate may have one precursor provided to it, while another region of the substrate has another precursor provided to it. In this way, a first material and a second material different from the first material are both formed on the substrate.

In operation 710, a plasma is provided to the first region and not the second region or to both the first region and the second region. In one embodiment, if the plasma is provided to both the first region and the second region, different precursors are provided to the first and second regions, respectively, so that a first material different from a second material is formed in the first and second regions of the substrate, respectively. In another embodiment, parameters of the plasma can be varied across regions where a plasma is struck in more than one region. Parameters or conditions of PECVD and PEALD that can be varied for combinatorial processing include power to ignite plasma, flow of plasma and other gasses, the type of plasma gas, pressure, selection of precursors, exposure time, etc. In some embodiments, different plasma gasses are provided to different regions so that some of the plasma gasses may ignite and others may not. In further embodiments, the distance between some segments 268 of the showerhead 214 to the pedestal 218 may vary (see FIG. 5). The distance between a segment 268 and the pedestal 218 can therefore also be a combinatorial variable. Operations 706-710 are repeated as necessary to generate the number of desired cycles for ALD to test gestation periods or to create the desired thickness of the layers.

In operation 712, the materials deposited on the substrate are characterized. Characterization can include any one of several techniques to measure physical and other properties of the deposited materials. For example, characterization may include measuring thickness (e.g., ellipsometry), density, phase, resistance, leakage, breakdown voltage, capacitance (i.e., dielectric constant), contact angle, and other properties using probes and other instruments. Characterization can also include imaging techniques such as scanning electron microscopy (SEM), tunneling electron microscopy (TEM), atomic force microscopy (AFM) and other techniques. Imaging techniques can be used to determine some properties of films, for example film composition and morphology. Other characterization techniques, including x-ray diffraction (XRD) to determine film phase and x-ray fluorescence (XRF) composition can also be used.

In operation 714, after characterization is complete, the materials are evaluated for further processing, such as is described regarding FIG. 1B. As described above, none, one, or both of the materials can be selected for further combinatorial processing (e.g., secondary or tertiary stage processing) or manufacturing.

V. Plasma Enhanced Deposition Examples
A. Plasma Enhanced ALD

Figure 8:
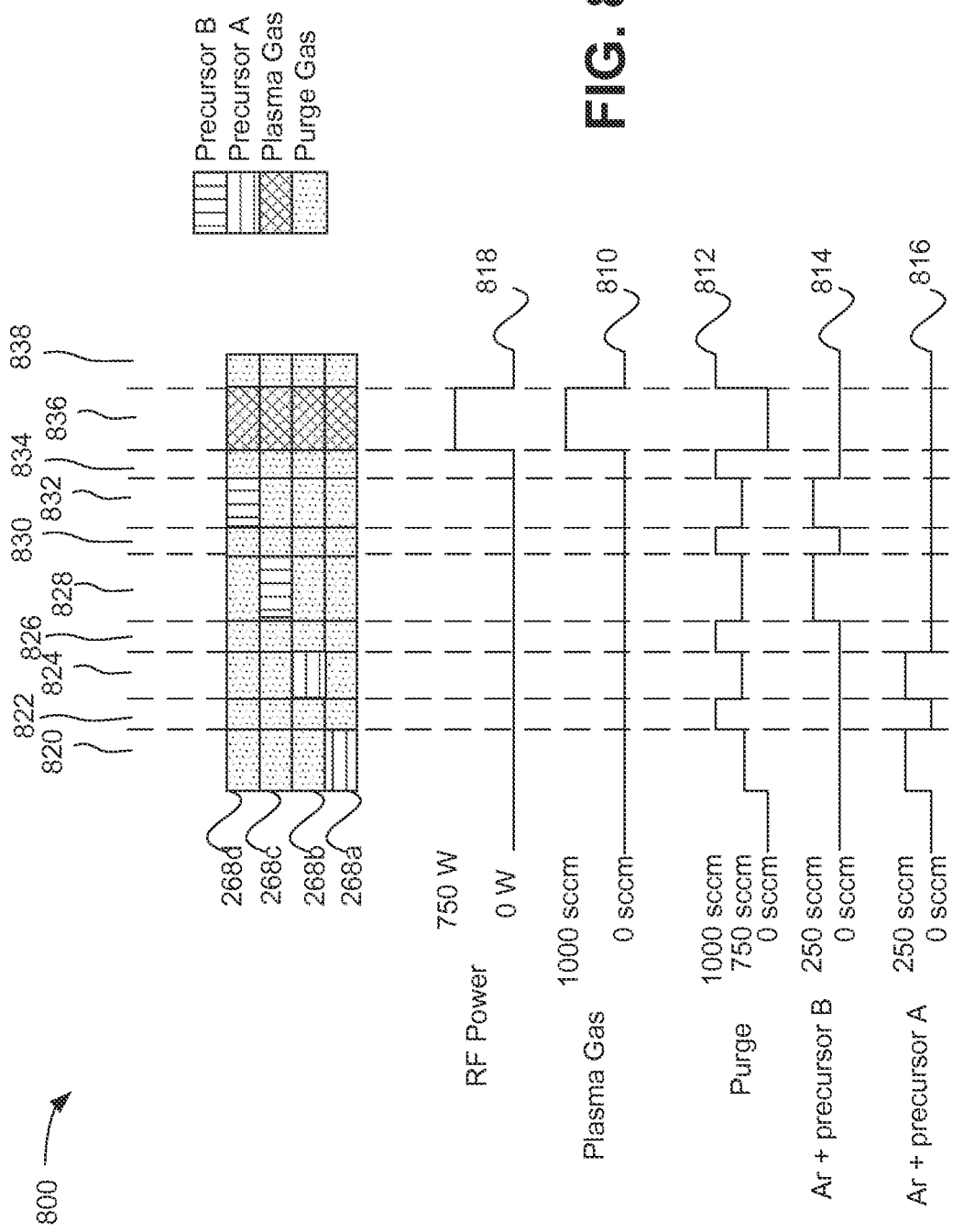
Figure 9:
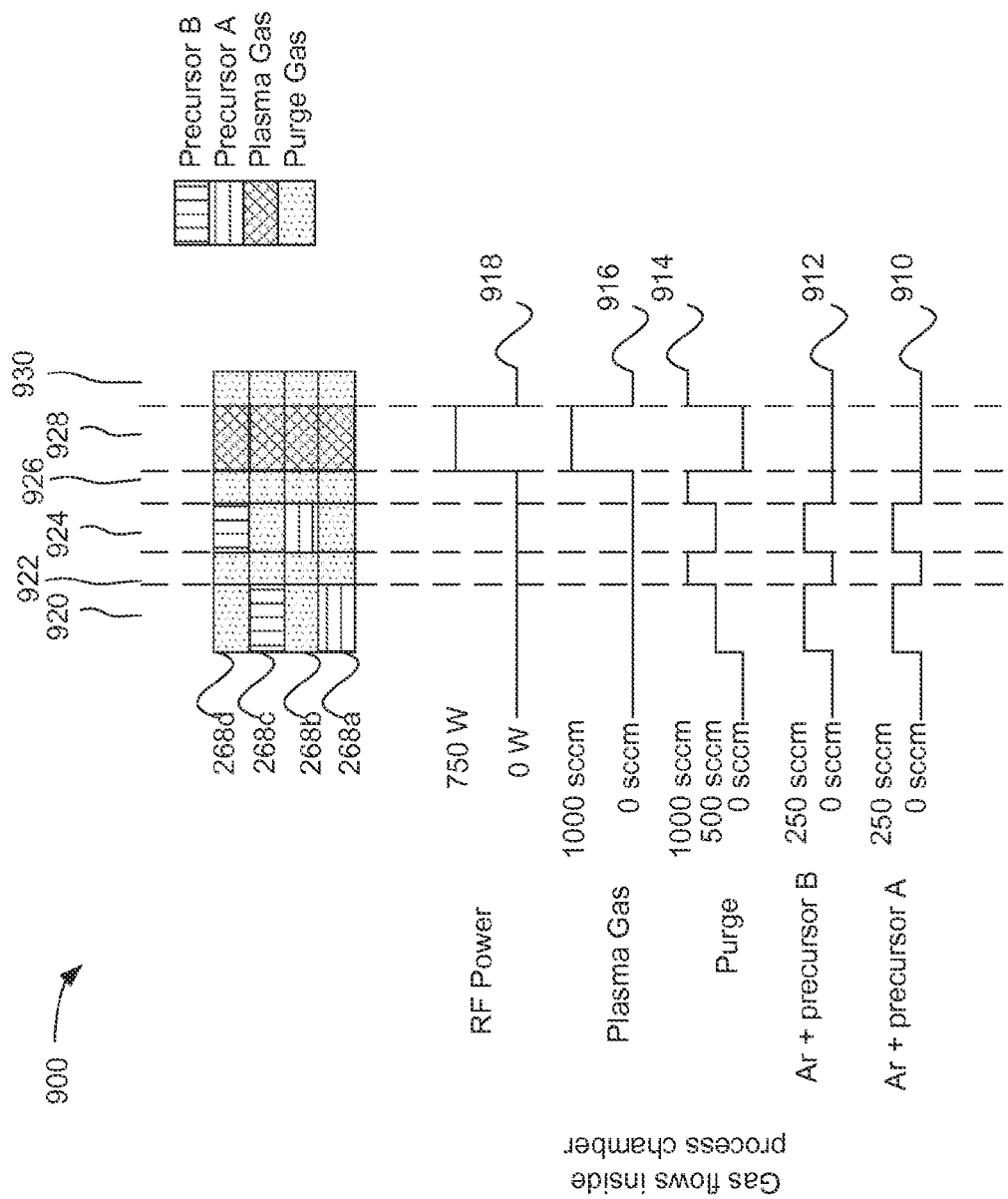
Figure 10:
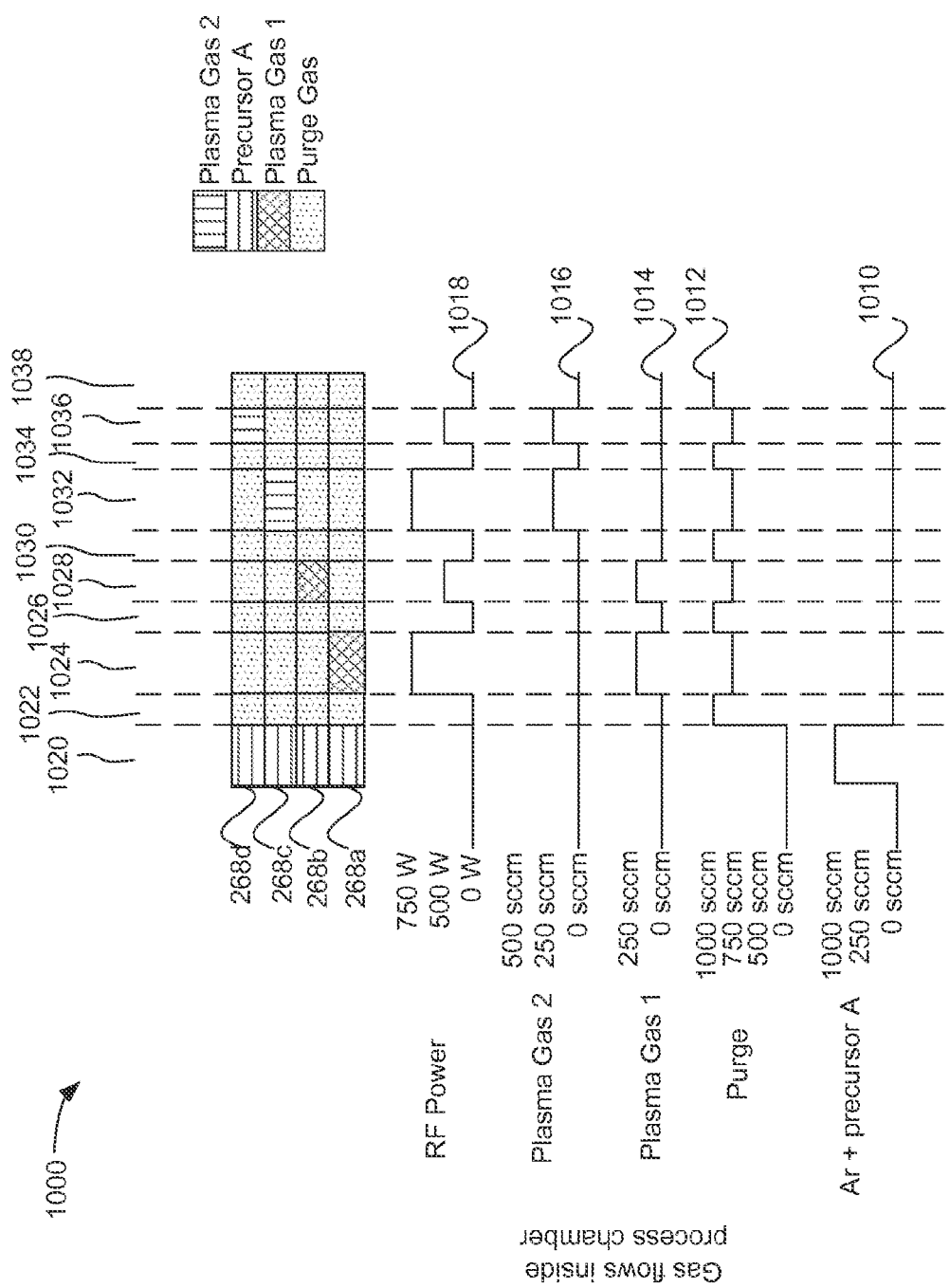

FIGS. 8-11 are timing diagrams for performing combinatorial plasma enhanced ALD processing. The timing diagrams describe several scenarios for forming multiple materials on a substrate using combinatorial PEALD. FIG. 8 shows a scenario where two different precursors are applied sequentially and plasma is applied across the substrate. FIG. 9 shows a scenario where two different precursors are applied simultaneously and plasma is applied across the substrate. FIG. 10 shows a scenario where a single precursor is used across the substrate and the plasma is varied between regions of the substrate. FIG. 11 shows a scenario where two different precursors are provided and plasma is varied across regions of the substrate. Other variations are possible and these examples are merely representative of the possible types of experimentation and not meant to be limiting in the possible applications of this invention. The cycles shown in FIGS. 8-11 can be repeated to deposit multiple layers.

I. Varying Precursors and Using a Common Plasma

As shown in FIG. 8, the flow into four segments of a showerhead are explained using the flow diagram 800. The flow through the four segments 268a, 268b, 268c, and 268d of the showerhead 214 is shown in the flow diagram 800. As described above, each segment 268 may correspond to a region 402 of a substrate 246 to deposit a material 302 thereon. The total flow through the showerhead 214 is approximately constant. For example, as shown here, the total flow through the showerhead is always approximately 1000 sccm (250 sccm for each segment), although any appropriate flow may be used. Additionally, although the flow is equal for each segment 268, in embodiments where segments 268 have different sizes or different configurations, different amounts of flow may be used for each segment 268.

The flow diagram 800 shows the flow of plasma gas 810, purge gas (e.g., nitrogen gas) 812, a first precursor A 816, and a second precursor B 814. The plasma gas can be selected according to Paschen's law (above) so that a plasma is ignited when desired. The RF power 818 is used to ignite the plasma. The precursor B 814 and precursor A 816 are typically small amounts of precursor chemical in a carrier gas. For example, the precursor chemical may be flowed at 1 sccm equivalent, while Argon carrier gas is flowed at 249 sccm.

The timing diagram is divided into several varying periods of time 820-838. During each period of time 820-838, a total of approximately 1000 sccm is flowed over the substrate 246. The 1000 sccm can comprise any combination of plasma gas 810, purge gas 812, precursor B and carrier gas 814 and precursor A and carrier gas 816. In this example, each segment 268 and region 402 receives approximately 250 sccm of flow. When the precursor is delivered to a region 402, each other region 402 is exposed to purge gas. So, at time 820, 250 sccm of precursor A and carrier gas is provided using segment 268a, while 750 sccm of purge gas is provided using segments 268b, 268c, and 268d.

Generally, as described above ALD can be considered a self-limiting process that uses two reagents. In this description, the first reagent is a precursor (e.g., precursor A or B, such as a hafnium precursor or aluminum precursor) and the second reagent is a reactant such as water vapor, ozone, or plasma (e.g., oxygen plasma). A typical ALD cycle may include flowing the precursor, purging to remove excess precursor, reacting the second reagent with the precursor to deposit a monolayer, and a subsequent purging to remove excess reagent. Additional monolayers can be deposited by repeating the cycle. In some embodiments, a submonolayer or more than a monolayer are deposited in a cycle.

As shown here, the precursor A is provided using segment 268a and segment 268b at times 820 and 824, respectively. Times 820 and 828 are longer than times 824 and 832, therefore more of precursor A and precursor B is provided during times 820 and 828 than during times 824 and 832. The length of time that the precursor is flowed over the substrate can be a combinatorial variable used to determine, for example, the amount of time needed to form a saturated adsorbed layer on the substrate. Times 820-834 describe the first half of the ALD cycle (providing the precursor and purging) for each of the segments 268.

The second half of the ALD cycle is completed by igniting a plasma at time 836. The plasma is struck by providing a voltage difference between the pedestal 218 and the showerhead 214. In this embodiment, a common plasma gas is flowed across all regions of the substrate, and plasma is struck in all regions. The ALD deposition process is completed at time 838 when the remaining gasses are purged. The cycle can be repeated to deposit multiple layers.

After forming the four different materials 302 in the four regions 402, each of the different materials 302 can be characterized (e.g., using electrical testing and/or imaging) and evaluated for subsequent processing.

FIG. 9 is a timing diagram 900 describing an ALD cycle in which two different precursors are delivered to two different regions of a substrate simultaneously. As with the timing diagram 800, the timing diagram 900 shows the flow to segments 268a-d. The flow of a first precursor A and carrier gas 910, the flow of a second precursor B and carrier gas 912, the flow of purge gas 914, the flow of plasma gas 916, and the amount of RF power 918 are shown in line graphs. The gas flowed into each of the segments 268a-d and the amount of flow or power 910-918 is shown for times 920-930.

As can be seen in the timing diagram 900, at time 920, precursor A and carrier gas is flowed through segment 268a and precursor B and carrier gas is flowed through segment 268c, while segments 268b and 268d flow purge gas. At time 922, the entire substrate 246 is purged to remove excess precursor. At time 924, precursor A and carrier gas is flowed through segment 268b and precursor B and carrier gas is flowed through segment 268d, while segments 268a and 268c flow purge gas. Again, at time 926, the entire substrate 246 is purged to remove excess precursor. Times 920-926 are the first half of an ALD cycle. Time 920 is longer than time 924, and this exposure time is a parameter than can be varied combinatorially.

At time 928, plasma gas is flowed through all segments 268a-d, and a plasma is struck by creating a voltage difference by applying RF power 918 between the showerhead 214 and the pedestal 218. Striking the plasma completes the ALD cycle and a monolayer is formed in each of the regions of the substrate 246. The substrate 246 is purged again at time 930. In some embodiments, the layer deposited may be a submonolayer or greater than a monolayer. The cycle can be repeated to deposit multiple layers.

2. Varying Plasma Across Regions

FIG. 10 is a timing diagram 1000 for varying plasma across regions when performing combinatorial PEALD. Segments 268a-d correspond to regions 402a-d on the substrate 246 that are combinatorially processed. This example uses a single precursor and multiple plasma gasses and exposure times to evaluate the effects of those parameters on depositing materials.

A graph 1010 shows the flow of precursor plus carrier gas. A graph 1012 shows the flow of purge gas. A graph 1014 shows the flow of a first plasma gas 1 and a graph 1016 show the flow of a second plasma gas 2. The graph 1018 shows the amount of RF power being used.

In this example, each of segments 268a-d receives 250 sccm of precursor A plus carrier gas at time 1020. As shown in graph 1010, precursor A plus carrier gas is flowed at 1000 sccm (i.e., 250 sccm for each of segments 268a-d). At time 1022, purge gas is flowed across the substrate to remove excess precursor. Times 1020 and 1022 describe the first half of an ALD cycle. Times 1024-1038 describe the second half of the ALD cycle.

The ALD cycle used here combinatorially varies plasma gas and the exposure time. For example, segments 268a and 268b flow plasma gas 1 at times 1024 and 1028, respectively. Time 1024 is longer than time 1028, and more power (i.e., 750W vs. 500W) is used to strike the plasma during time 1024. In some embodiments, plasma gas 1 may be chosen such that conditions are not sufficient to strike a plasma in segment 268b (e.g., not enough power or too much distance/separation). Optionally, another second reagent can be used to complete the formation of the ALD layer.

Regions corresponding to segments 268c and 268d are exposed to plasma gas 2 at times 1032 and 1036, respectively. Time 1032 is longer than time 1036 and more power (i.e., 750W vs. 500W) is used to strike the plasma at time 1032 than at time 1036.

In these embodiments, the effects of two different plasma gasses, different power levels, and different exposure times can be evaluated so that an optimum solution can be derived. The deposited layer may, in various embodiments, be a monolayer, submonolayer, or greater than a monolayer.

FIG. 11 is a timing diagram 1100 describing an embodiment where two different precursors are delivered simultaneously and two different plasma gasses are delivered simultaneously. As with the other timing diagrams, timing diagram 1100 shows the delivery of gasses through segments 268a-d at times 1122-1132. The power or flow of each gas or power source is shown in graphs 1110-1120.

At time 1122, a first precursor A is delivered to segment 268a and a second precursor B is delivered to segment 268c. At time 1124, the substrate 246 is purged to remove excess precursor. At time 1126, precursor A is delivered to segment 268b and precursor B is delivered through segment 268d. At time 1128, the substrate 246 is again purged to remove excess precursor. Time 1122 is longer than time 1126, therefore the exposure time of the precursors to the substrate is varied combinatorially. Times 1122-1128 are the first half of an ALD cycle.

Times 1130 and 1132 are the second half of the ALD cycle. The second reagent is again the plasma, which is delivered at time 1130. Two plasma gasses are simultaneously delivered to the substrate: plasma gas 1 to segments 268a and 268b, and plasma gas 2 to segments 268c and 268d. Full RF power 1120 is provided at time 1130 to ignite the plasma throughout the substrate. In some embodiments, the plasma gas 1 may be a gas that is easy to ignite (e.g., Ar), while plasma gas 2 is a gas that is difficult to ignite (e.g., $H_2$), so that plasma is provided in the regions corresponding to the segments 268a and 268b and not in the regions corresponding to segments 268c and 268d. The deposited layer may, in various embodiments, be a monolayer, submonolayer, or greater than a monolayer.

3. Other Examples

The four timing diagrams 800, 900, 1000, and 1100 are examples of combinatorially varied PEALD. Various other processes can be developed and used according to embodiments of the invention. For example, in some embodiments, plasma can be used in the ALD cycle to deposit a material in one or more regions of a substrate, while another reagent (e.g., water vapor) is used to form an ALD deposited material in other regions. In this way, the differences between conventional ALD and PEALD can be explored using a single experiment. Also according to other embodiments, more than two different precursors could be used, and other variables could be explored.

B. Plasma Enhanced CVD

PECVD uses plasma as an enhancement to improve reaction rates and to reduce processing temperatures. Plasma can also be used with CVD to vary the film properties, e.g., density, composition, step coverage, adhesion, dielectric constant, film leakage, breakdown voltage, etc. Various different scenarios can be used to perform combinatorial processing using PECVD. As with combinatorial PEALD, precursors can be varied across regions while plasma is applied to all regions of the substrate. According to another example, plasma can be provided in one or more regions, while not provided in others. In this second example, the same precursor can be provided to all regions, or the precursor or other parameters of the PECVD can be varied.

Unlike ALD, CVD is not self-limiting, and CVD films continue to grow the longer a substrate is exposed to the CVD precursors and plasma. For some CVD processes, one or more precursors and a plasma can be provided simultaneously for a desired amount of time to grow a layer of a desired thickness. As a result, for combinatorial PECVD, several parameters for CVD can be varied to determine an optimum solution such as precursor exposure time, precursor mixture, plasma gas composition and voltages.

For example, two regions can be exposed to the same precursor for different amounts of time to study the growth rate of the precursors. Alternatively, two regions could be exposed to the same precursor, one region with plasma and the other without for the same amount of time to study the change in growth rate when using plasma. As with PEALD, different plasma gasses, different distances between the pedestal 218 and the showerhead 214 (see FIG. 5), and other plasma variable can be compared for PECVD to determine an optimum plasma solution. The other embodiments described above, e.g., rotating the pedestal 218, can also be used for combinatorial PECVD.

In one embodiment, a material deposition system is described. The material deposition system includes a pedestal, and a showerhead disposed opposite the pedestal. The showerhead includes multiple segments to simultaneously flow different fluids, a first segment of the showerhead is configured to provide a first precursor and a plasma between the pedestal and the showerhead to deposit a first material, and a second segment of the showerhead is configured to deposit a second material different from the first material.

In another embodiment, the showerhead and the pedestal are conductive and the plasma is provided by generating a power through a first gas emitted by the showerhead and between the showerhead and the pedestal.

In another embodiment, a first distance between the first segment and the pedestal is sufficient to cause a breakdown voltage and ignite the plasma under the first segment when the power is generated while no plasma is generated in the second region.

In another embodiment, the showerhead includes multiple protrusions between the multiple segments to designate multiple regions.

In another embodiment, the material deposition system includes a body inside a plenum of the showerhead to direct the first precursor toward the first region.

In another embodiment, the plasma is generated externally from the showerhead and provided to the substrate through the showerhead.

In another embodiment, a second gas different from the first gas is emitted by the second segment, and the plasma is not ignited in the second gas.

In another embodiment, material deposition system is one of a chemical vapor deposition (CVD) system, an atomic layer deposition (ALD) system, a plasma enhanced CVD (PECVD) system and a plasma enhanced ALD (PEALD) system.

In another embodiment, the pedestal is grounded and the showerhead is attached to an RF power supply.

In another embodiment, the showerhead is grounded and the pedestal is attached to an RF power supply.

In one embodiment, a method is described, including designating multiple regions of a substrate, providing a global flow of fluids to the multiple regions of the substrate including providing a first precursor to at least a first region of the multiple regions, and providing a plasma to the multiple regions to deposit a first material on the first region formed using the first precursor. In this embodiment, the first material is different from a second material formed on a second region of the substrate.

In another embodiment, providing a global flow includes providing approximately equal fluid flow to each of the multiple regions.

In one embodiment, a method is described, including designating multiple regions on a substrate, applying a first plasma to a first region of the multiple regions and not to a second region of the multiple regions, and providing a first precursor to the first region to deposit a first material in the first region.

In another embodiment, the method further includes providing the first precursor to the second region to deposit the first material in the second region.

In another embodiment, the method further includes providing a second precursor to the second region to deposit a second material in the second region.

In another embodiment, the method further includes providing a second plasma in the first region to deposit the first material.

In another embodiment, the method further includes providing the second plasma in the second region to deposit the second material.

In another embodiment, the method further includes providing no plasma in the second region to deposit the second material.

Although the foregoing examples have been described in some detail for purposes of clarity of understanding, the invention is not limited to the details provided. There are many alternative ways of implementing the invention. The disclosed examples are illustrative and not restrictive.

What is claimed:

1. A system for combinatorial processing of a plurality of discrete regions on a substrate comprising
   a chamber with a controlled atmosphere,
   a gas delivery system operable to deliver a first precursor gas to a first discrete region on a substrate, and
   a plasma generator operable to selectively expose the first discrete region to a plasma;
   wherein the first precursor gas and the plasma can interact to deposit a first material on the first discrete region, and
   wherein the first material is a different material from a second material formed on a second discrete region on the substrate.

2. The system of claim 1, wherein the first material is deposited by plasma-enhanced chemical vapor deposition.

3. The system of claim 1, wherein the first material is deposited by plasma-enhanced atomic layer deposition.

4. The system of claim 1, wherein the second material is deposited without exposing the second discrete region to a plasma.

5. The system of claim 1,
   wherein the gas delivery system is operable to deliver a second precursor gas to the second discrete region on a substrate;
   wherein the plasma generator is operable to expose the second discrete region to a plasma; and
   wherein the second precursor gas and the plasma can interact to deposit a second material on the second discrete region.

6. The system of claim 1, wherein the plasma generator is a remote plasma source.

7. The system of claim 1, wherein the gas delivery system and the plasma generator are operable to deliver the first precursor gas to the first discrete region and to expose the first discrete region to the plasma at substantially the same time.

8. The system of claim 1, wherein the gas delivery system and the plasma generator are operable to deliver the first precursor gas to the first discrete region and then to expose the first discrete region to the plasma sequentially.

9. The system of claim 1, wherein the gas delivery system comprises a segmented showerhead, wherein a first segment of the showerhead is operable to deliver the first precursor gas to the first discrete region, and a second segment of the showerhead is operable to deliver a second precursor gas to the second discrete region.

10. The system of claim 9, further comprising protrusions extending from the showerhead toward the substrate, wherein the protrusions are disposed and operable to isolate each discrete region of the substrate and substantially prevent gases from migrating from one discrete region into an adjoining discrete region.

11. The system of claim 9, further comprising a pedestal supporting the substrate, wherein a voltage difference between the pedestal and the showerhead is set such that a plasma is ignited above the first discrete region on the substrate.

12. The system of claim 11, wherein the distance between the substrate and the showerhead is set such that a plasma is ignited above the first discrete region on the substrate.

13. The system of claim 12, wherein a plasma is not ignited above a second discrete region on the substrate.

14. The system of claim 9, wherein the gas composition above each discrete region is selected so that a plasma ignites over some discrete regions of the substrate and not others.

15. The system of claim 1, wherein a plasma generator is operable to pre-treat at least one discrete region before a precursor gas is delivered to the at least one discrete region.

16. The system of claim 15, wherein the plasma generator operable to pre-treat at least one discrete region is operable to selectively treat the at least one discrete region while not pre-treating at least one other discrete region.

17. The system of claim 15, wherein the plasma generator operable to pre-treat at least one discrete region is operable to pre-treat all discrete regions simultaneously.

18. The system of claim 1, further comprising a module operable to characterize the deposited layers in each discrete region on the substrate.

19. The system of claim 1, further comprising a control system operable to vary, in a combinatorial manner, the composition, flow rate, and timing of precursor gasses delivered to each of the plurality of discrete regions.

20. The system of claim 1, further comprising a control system operable to vary, in a combinatorial manner, the composition, flow rate, and timing of a plasma to which each of the plurality of discrete regions is exposed.

* * * * *